United States Patent [19]
Rhodes et al.

[11] Patent Number: 5,223,730
[45] Date of Patent: Jun. 29, 1993

[54] STACKED-TRENCH DRAM CELL THAT ELIMINATES THE PROBLEM OF PHOSPHORUS DIFFUSION INTO ACCESS TRANSISTOR CHANNEL REGIONS

[75] Inventors: Howard E. Rhodes; Guy T. Blalock, both of Boise, Id.

[73] Assignee: Micron Technology, Inc., Boise, Id.

[21] Appl. No.: 829,859

[22] Filed: Feb. 3, 1992

[51] Int. Cl.⁵ .................. H01L 29/68; H01L 29/78; H01L 29/92
[52] U.S. Cl. .................................. 257/301; 257/296; 257/303; 257/304; 257/311
[58] Field of Search ............... 257/296, 297, 301, 303, 257/305, 304, 311, 532, 534

[56] References Cited

U.S. PATENT DOCUMENTS

| | | | |
|---|---|---|---|
| 4,845,539 | 7/1989 | Inoue | 257/303 |
| 5,010,379 | 4/1991 | Ishii | 257/303 |

FOREIGN PATENT DOCUMENTS

| | | | |
|---|---|---|---|
| 62-249473 | 10/1987 | Japan | 257/303 |
| 1-149453 | 6/1989 | Japan | 257/301 |
| 1-160047 | 6/1989 | Japan | 257/303 |

*Primary Examiner*—Sara W. Crane
*Attorney, Agent, or Firm*—Angus C. Fox, III

[57] ABSTRACT

This invention eliminates the problem of phosphorus diffusion from the storage-node capacitor plate of a stacked-trench DRAM cell into the access transistor channel region of that cell by lining the trench sidewalls with a dielectric lining and making electrical contact to the access transistor through the bottom of the trench, which, like the sidewalls thereof, is doped with a slow-diffusing N-type impurity. The phosphorus in the storage-node capacitor plate is thus distanced from the access transistor channel so that diffusivity ceases to affect access transistor performance characteristics.

10 Claims, 13 Drawing Sheets

STACKED-TRENCH DRAM CELL THAT ELIMINATES THE PROBLEM OF PHOSPHORUS DIFFUSION INTO ACCESS TRANSISTOR CHANNEL REGIONS

FIELD OF THE INVENTION

This invention relates to semiconductor technology and, more specifically, to the design and manufacture of capacitors used in dynamic random access memory (DRAM) cells. The focus of the invention is the use of thin dielectric spacers on the sidewalls of the trench of a stacked-trench DRAM cell to prevent the diffusion of phosphorus dopant atoms from the lower capacitor plate into access transistor channel regions.

BACKGROUND OF THE INVENTION

The memory cells of dynamic random access memories are comprised of two main components: a field-effect transistor and a capacitor. In DRAM cells utilizing a conventional planar capacitor, far more chip surface area is dedicated to the planar capacitor than to the field-effect transistor (FET). Wordlines are generally etched from a first doped polycrystalline silicon (hereinafter, "polysilicon" or "poly") layer. A doped region of silicon substrate functions as the lower (storage-node) capacitor plate, while a second doped polysilicon layer generally functions as the upper capacitor plate (cell plate). Although planar capacitors have generally proven adequate for use in DRAM chips up to the one-megabit level, they are considered to be unusable for more advanced DRAM generations. As component density in memory chips has increased, the shrinkage of cell capacitor size has resulted in a number of problems. Firstly, the alpha-particle component of normal background radiation can generate hole-electron pairs in the silicon substrate, which functions as the lower capacitor plate. This phenomena will cause a charge stored within the affected cell capacitor to rapidly dissipate, resulting in a "soft" error. Secondly, the sense-amplifier differential signal is reduced. This aggravates noise sensitivity and makes it more difficult to design column sense-amplifiers having appropriate signal selectivity. Thirdly, as cell capacitor size is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

As a result of the problems associated with the use of planar capacitors for high-density DRAM memories, all manufacturers of 4-megabit DRAMs are utilizing cell designs based on non-planar capacitors. Two basic non-planar capacitor designs are currently in use: the trench capacitor, and the stacked capacitor. Both types of non-planar capacitors typically require a considerably greater number of masking, deposition and etching steps for their manufacture than does a planar capacitor.

In a trench capacitor, charge is stored primarily vertically, as opposed to horizontally in a planar capacitor. Since trench capacitors are fabricated in trenches which are etched in the substrate, the early trench capacitors, like planar capacitors, was particularly susceptible to soft errors. In addition, there are several other problems inherent in the trench design. One problem is that of trench-to-trench charge leakage, caused by the parasitic transistor effect between adjacent trenches. Another problem is capacitor leakage related to defects in the substrate crystal structure brought about by either the trench etch itself or by thermal cycling of different materials which are in intimate contact and which have different coefficients of expansion. Another problem is the difficulty of completely cleaning the trenches during the fabrication process; failure to completely clean a trench will generally result in a defective cell.

The stacked capacitor design, on the other hand, has proven somewhat more reliable and easier to fabricate than the trench design. Since both the lower and the upper plates of a typical stacked capacitor are formed from individual conductive layers, the stacked capacitor is generally much less susceptible to soft errors than either the planar or trench capacitors. By placing the wordline and, in some designs, also the digitline beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell.

Although the stacked cell capacitor has proven to be the most manufacturable design for the four-megabit generation, trenches are generally considered to be a good bet for future generations, due to the fact that trenches can be made deeper for increased capacitance, without affecting topography of the array. However, the continuing development of new technology makes it impossible to reliably predict the design of future DRAM generations. For example, the problems of crystal defect-related capacitor leakage and high soft error rate, which were characteristic of early trench designs has been solved by lining the trenches with a dielectric material and using a deposited conductive layer for the storage-node plate. Furthermore, advances in stacked capacitor technology promise to make that design a participant in the 64-megabit generation. For example, complex three-dimensional structures have been created that greatly increase storage-node plate surface area. Generally, however, such structures require complex processing and multiple photomasks.

The electrodes, or plates, of a stacked capacitor are typically patterned from individual layers of conductively-doped polycrystalline silicon (hereinafter also "polysilicon"). One problem related to the use of a conductively-doped polysilicon layer for the bottom plate of a DRAM capacitor is that, unless the storage-node plate contact with the substrate is made a considerable distance from the cell access transistor, the dopant impurities from the polysilicon storage-node plate will tend to diffuse into the channel of the cell access transistor, resulting in lowered threshold voltages and high leakage current through the transistor when the gate is not activated.

A new capacitor design, which incorporates aspects of both the stacked and trench designs in order to further increase capacitor plate area, has recently been receiving considerable attention in the DRAM industry. Like the stacked capacitor, the new capacitor utilizes deposited conductive layers for both capacitor plates. However, in the stacked-trench capacitor, the storage-node plate lines a trench in the substrate in addition to covering the wordline. The most space-efficient way of making a stacked-trench capacitor is to etch the trench so that it is self-aligned both to an adjacent field oxide region and to the vertical edge of the access transistor gate spacer. If the capacitor has a phosphorus-doped polycrystalline silicon storage-node capacitor plate, such a structure is particularly susceptible to the outdiffusion of phosphorus from the storage-node plate into the channel region of the adjacent access transistor, resulting in lowered access transistor threshold voltages and high leakage current.

One solution that has been proposed for this problem is the use of arsenic as an exclusive dopant for the storage-node plate. However, it is much more difficult to dope a poly layer with arsenic than with phosphorus. Another proposed solution is to line the trench with a material that is an effective barrier against the diffusion of phosphorus, such as titanium nitride. However, high-temperature processing of the wafer would have to end with the titanium nitride deposition. This is a definite disadvantage.

What is needed is a new stacked-trench cell design which permits the doping of the storage-node plate with phosphorus, yet which eliminates the problem of phosphorus diffusion from the storage-node plate into the channel region.

SUMMARY OF THE INVENTION

This invention eliminates the problem of phosphorus diffusion from the storage-ode capacitor plate of a stacked-trench DRAM cell into the access transistor channel region of that cell.

The problem of outdiffusivity is solved by doping the trench sidewalls with arsenic, creating a dielectric lining on the arsenic-doped sidewalls, and making electrical contact to the access transistor through the arsenic-doped sidewalls from the bottom of the trench. The phosphorus in the storage-node capacitor plate is thus distanced from the access transistor channel so that diffusivity ceases to affect access transistor performance characteristics.

DETAILED DESCRIPTION OF THE PREFERRED EMBODIMENT

Figure 1:
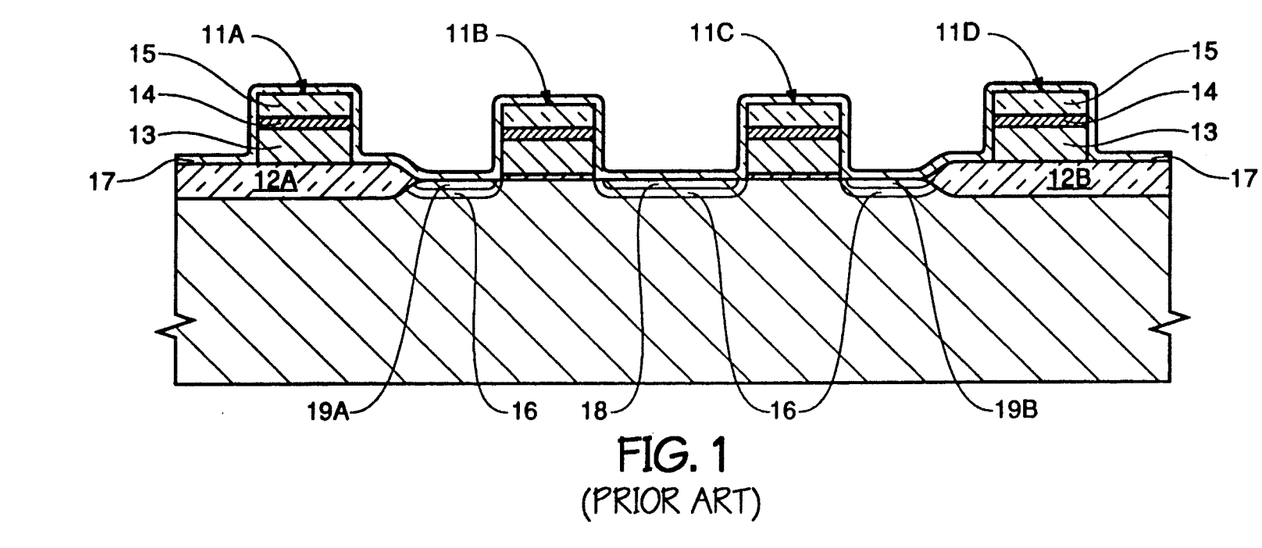
FIG. 1 is a cross-sectional view of an in-process DRAM array at a manufacturing stage where active areas and field oxide regions have been created, wordlines have been patterned from a silicon dioxide coated, silicided polysilicon-1 layer, a boron punchthrough region has been implanted aligned to the vertical edges of the wordlines, a first silicon dioxide spacer layer has been conformally deposited over the array surface, and lightly-doped junction regions have been created by implanting phosphorus aligned to the vertical portions of the first spacer layer.

Referring now to FIG. 1, a small portion of an in-process dynamic random access memory (DRAM) array which will completed by fabricating cell capacitors of stacked trench design, is depicted at the beginning of the cell capacitor fabrication stage. Four wordlines 11A, 11B, 11C and 11D are depicted in this cross-sectional view. In the portion of the array that is depicted, wordlines 11A and 11D are traversing field oxide regions 12A and 12B respectively. Wordlines 11A and 11B, on the other hand, are traversing an active area. Each wordline has been patterned from a silicon-dioxide-coated, silicided polysilicon-1 layer 13, so that each wordline is coated with a refractory metal silicide layer 14 for decreased sheet resistance, and a silicon dioxide isolation layer 15. During wafer processing up to this stage, an anti-punchthrough region 16 has been created by vertically implanting boron, with the boron-implanted region being aligned to the vertical edges of the wordlines, a first silicon dioxide spacer layer 17 has been conformally deposited over the array surface, lightly-doped access-node junction region 18 and storage-node junction regions 19A and 19B have been created by vertically implanting phosphorus, with the phosphorus-implanted region being aligned to the vertical portions of first spacer layer 17. Wordline 11B thus forms a first access transistor in combination with access-node junction 18 and storage-node junction 19A, while wordline 11C forms a second access transistor in combination with access-node junction 18 and storage-node junction 19B.

Figure 2:
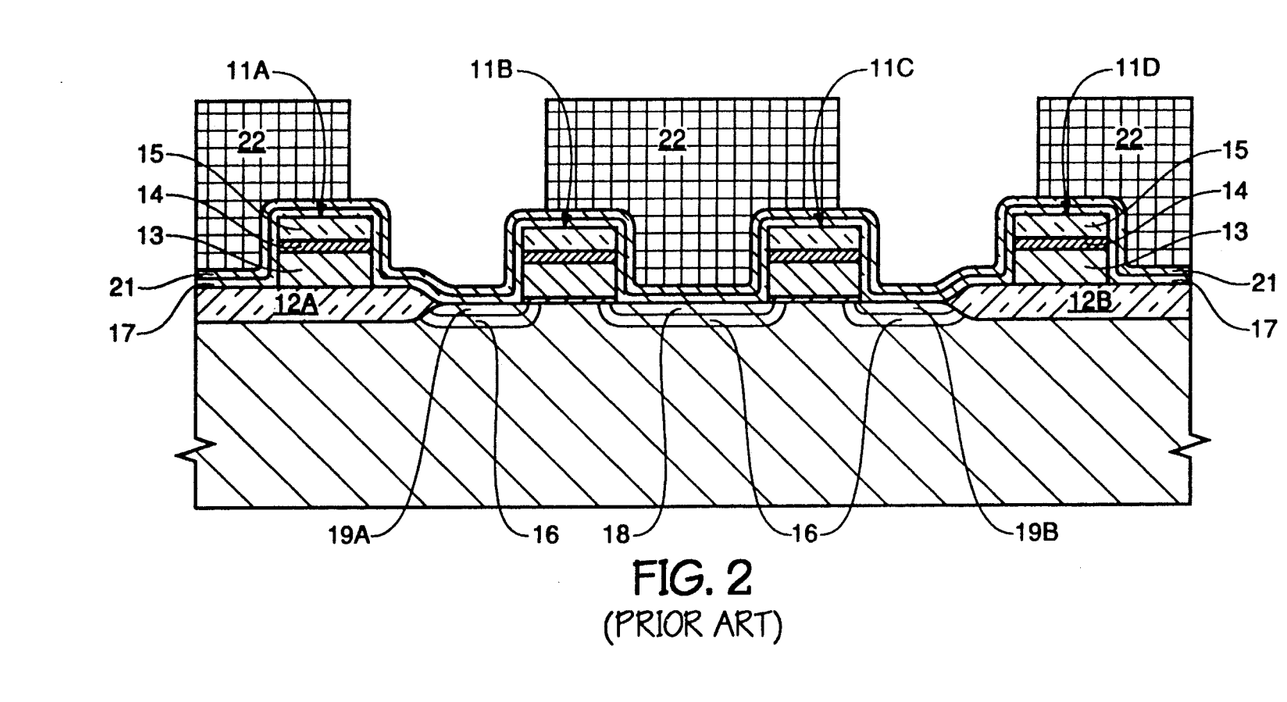
FIG. 2 is a cross-sectional view of the in-process DRAM array of FIG. 1 following an elevated temperature step drive step, deposition of a second silicon dioxide spacer layer, an oxide densification step and creation of a storage-node contact photoresist mask.

Referring now to FIG. 2, an elevated-temperature drive step has caused the implanted boron and phosphorus atoms in anti-punchthrough region 16 and lightly-doped junction regions 18, 19A and 19B, respectively, to diffuse in a controlled manner beneath the edges of gates 11B and 11C. A second silicon dioxide spacer layer 21 is then conformally deposited, following which spacer layers 17 and 21 have been densified with a further elevated temperature step. The array is then masked with a storage-node contact photoresist mask 22.

Figure 3:
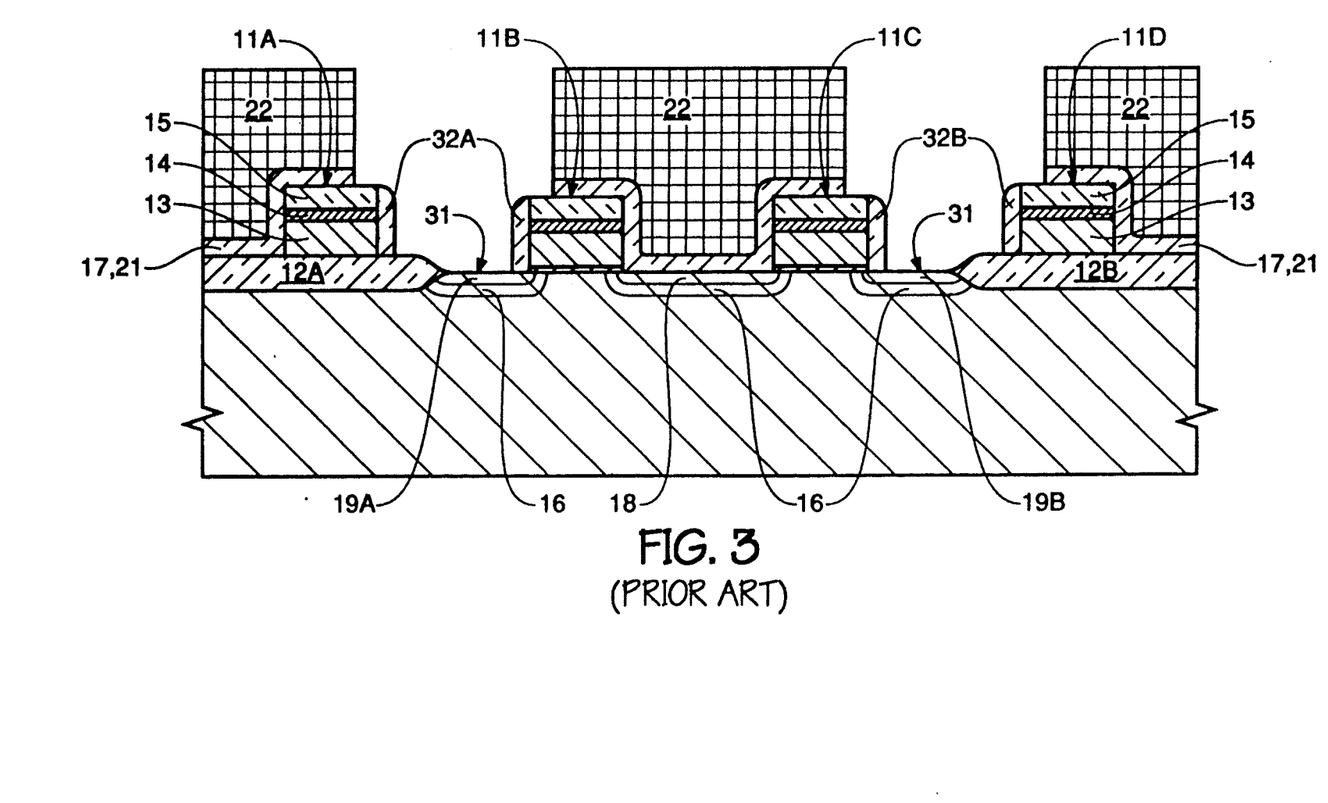
FIG. 3 is a cross-sectional view of the in-process DRAM array of FIG. 2 following an oxide etch, which clears silicon dioxide spacer layers from horizontal surfaces in the storage-node contact regions and creates dielectric spacers on the sidewalls of the wordlines in the storage-node contact regions.

Referring now to FIG. 3, an anisotropic oxide etch has removed the horizontal portions of silicon dioxide spacer layers 17 and 21 in the storage-node contact regions 31 and has created dielectric spacers 32A and 32B on the sidewalls of wordlines 11B and 11C, respectively.

Figure 4:
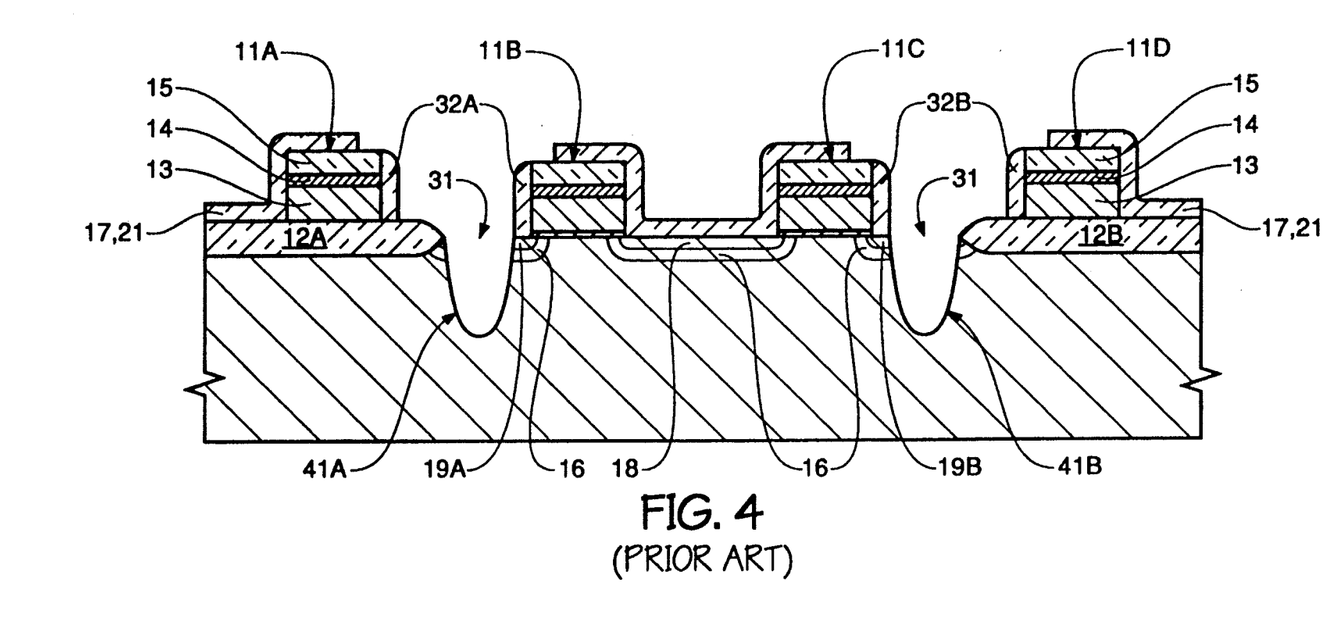
FIG. 4 is a cross-sectional view of the in-process DRAM array of FIG. 3 following an anisotropic silicon etch which creates trenches in the substrate where it is cleared of silicon oxide.

Referring now to FIG. 4, storage-node contact photoresist mask 22 has been removed, and an anisotropic silicon etch is performed which creates tapered trenches 41A and 41B in the substrate in the storage-node contact regions 31. It will be noted that trench 41A is aligned to a field oxide region 12A and spacer 32A, while trench 41B is aligned to field oxide region 12B and spacer 32B.

Figure 5:
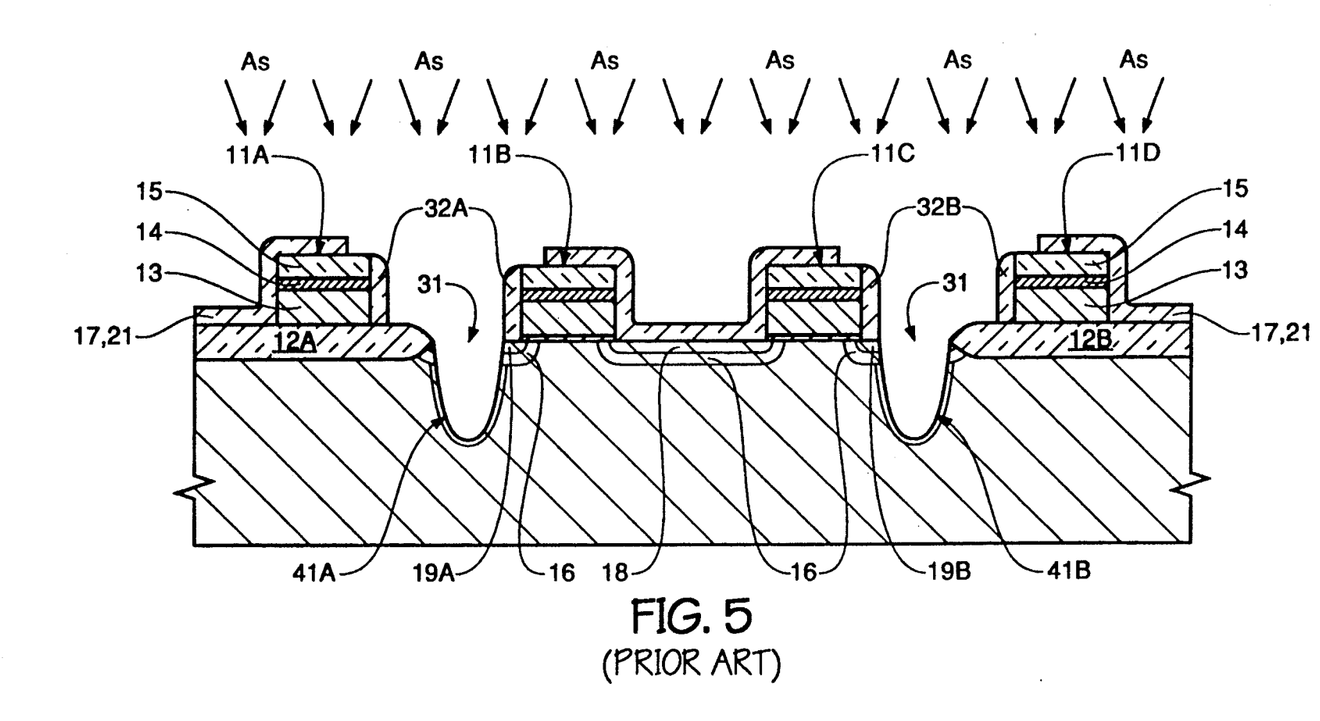
FIG. 5 is a cross-sectional view of the in-process DRAM array of FIG. 4 following an angled arsenic implant.

Referring now to FIG. 5, an angled implant using a slow-diffusing N-type impurity such as, but not limited to, arsenic or antimony, has been performed, which dopes the bottom and sidewalls of each tapered trench 41.

Figure 6:
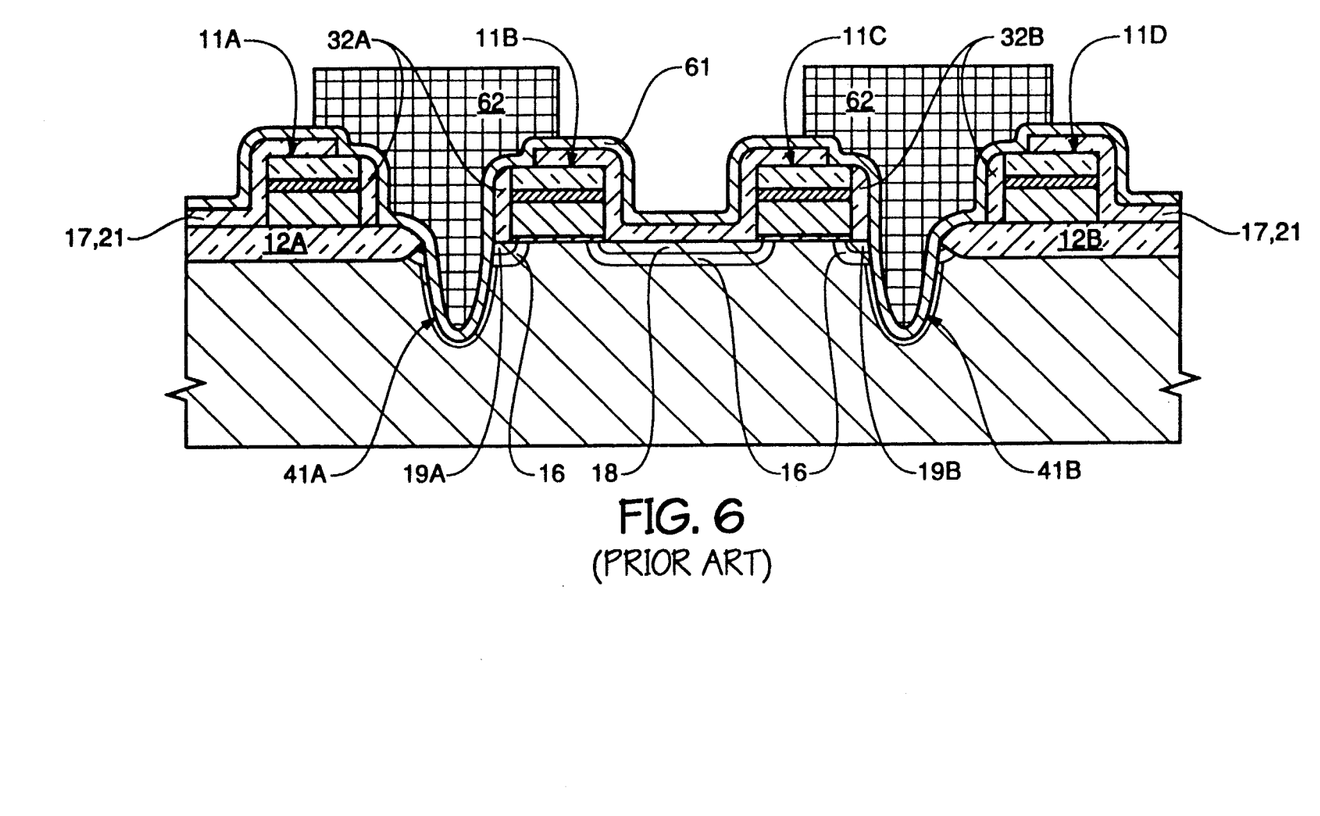
FIG. 6 is a cross-sectional view of the in-process DRAM array of FIG. 5 which depicts the beginning of a series of conventional steps aimed at completing the array (i.e., deposition of a conformal storage-node plate layer and masking of same with photoresist)

Referring now to FIG. 6, fabrication of the lower capacitor plates of a conventional stacked-trench array is begun by conformally depositing a polysilicon-2 layer 61 over the surface of the array, completely lining each tapered trench 41. Following doping of the polysilicon-2 layer 61 with phosphorus, the array is masked with a storage-node plate photoresist mask 62.

Figure 7:
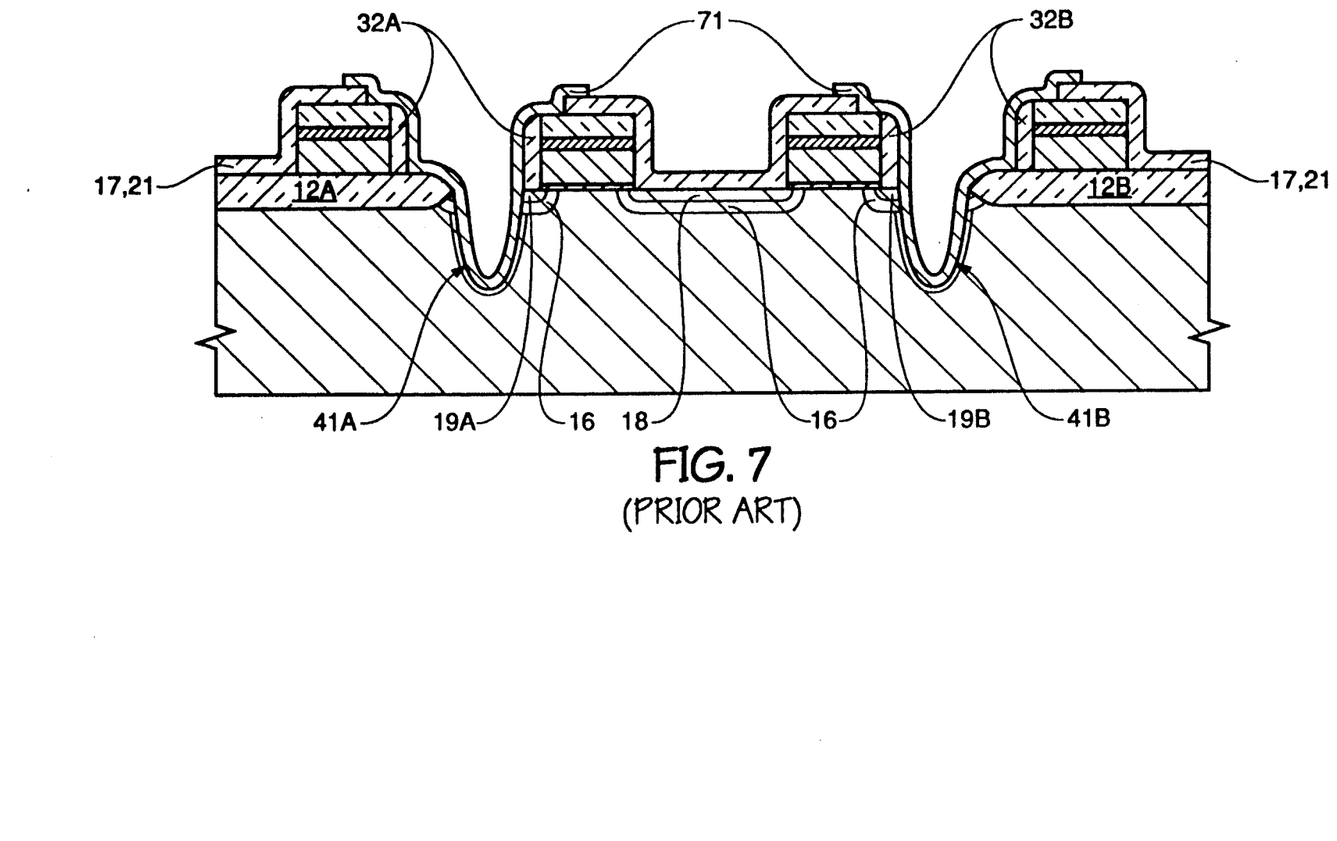
FIG. 7 is a cross-sectional view of the in-process DRAM array of FIG. 6 following an etch of the storage-node plate layer and a photoresist strip.

Referring now to FIG. 7, the array has been subjected to a polysilicon etch, which creates individual storage node plates 71. Following this etch, photoresist mask 62 is stripped.

Figure 8:
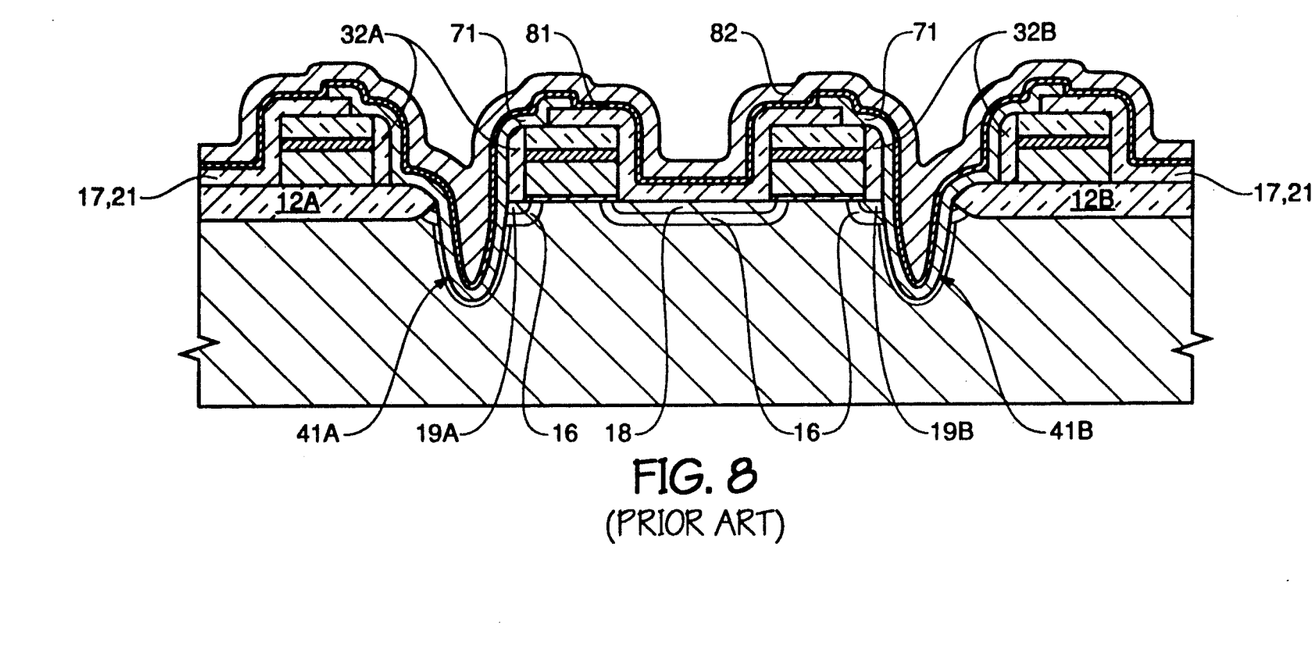
FIG. 8 is a cross-sectional view of the in-process DRAM array of FIG. 7 following deposition of a capacitive dielectric layer and deposition of a cell plate layer.

Referring now to FIG. 8, a capacitor dielectric layer 81 is conformally deposited over the array's surface, following which a polysilicon-3 cell plate layer 82 is conformally deposited. At this point, the storage capacitors are completely formed. Contact to access-node junction 18 will later be made. This conventional stacked-trench cell design is particularly susceptible to the diffusion of phosphorus from the heavily-doped storage node plate to the access transistor channel, due to the close proximity of the channel to the plate. Such diffusion will have adverse effects on transistor performance, including a reduced threshold voltage and high leakage current.

Figure 9:
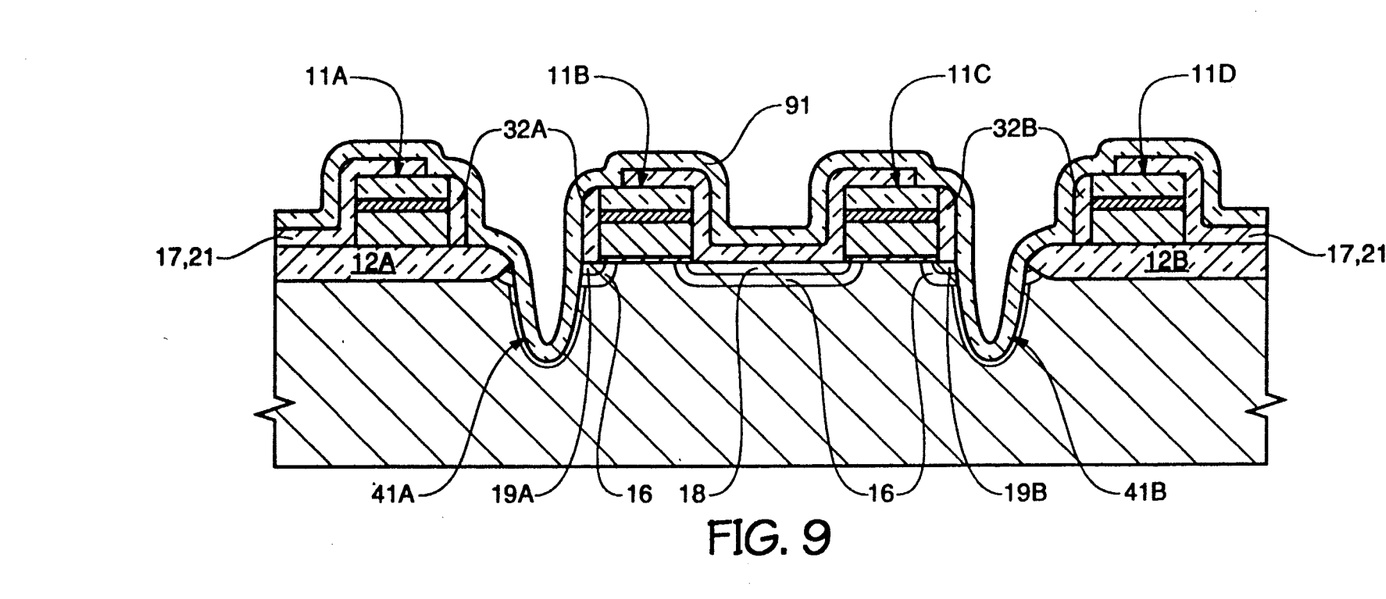
FIG. 9 is a cross-sectional view of the in-process DRAM array of FIG. 5 which depicts the beginning of a series of steps which are aimed at completing the array in accordance with the present invention, the first step in the series being the deposition of a dielectric material lining layer.
Figure 10:
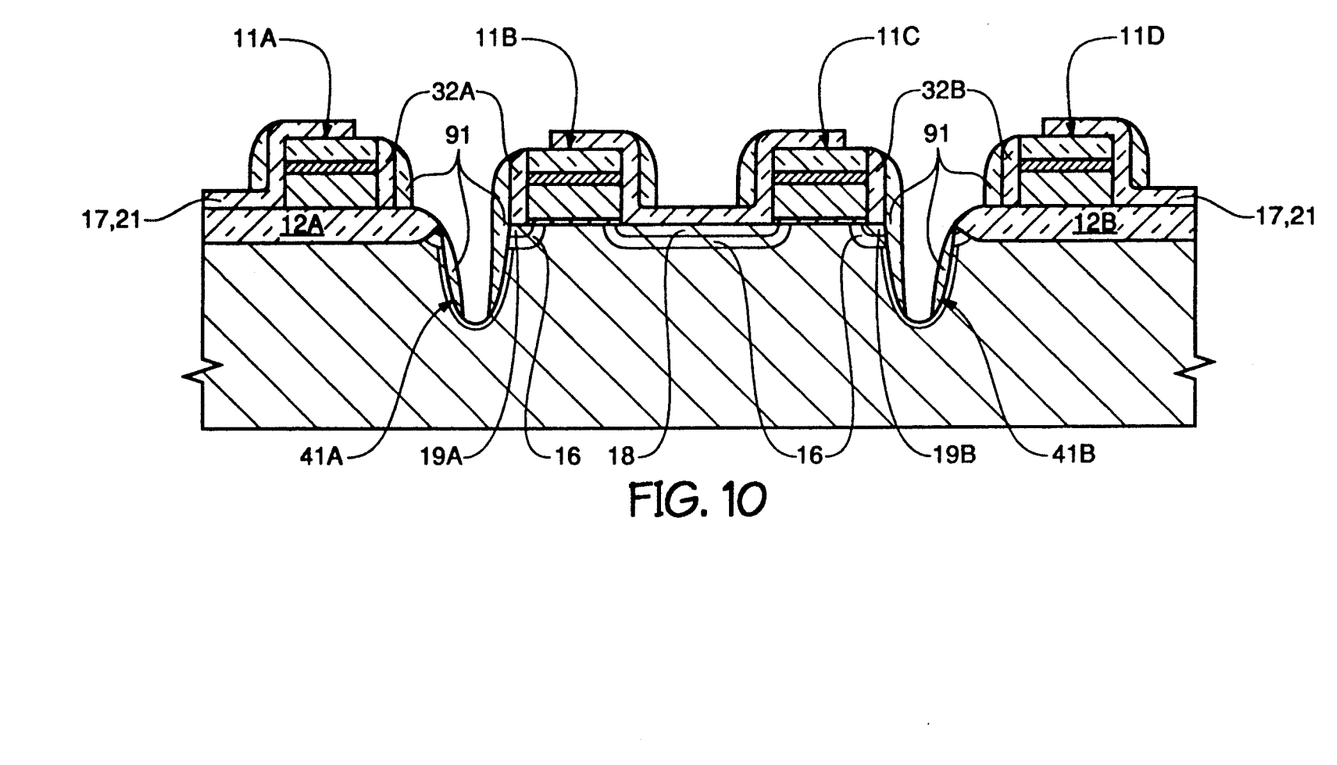
FIG. 10 is a cross-sectional view of the in-process DRAM array of FIG. 9 following an anisotropic etch of the third silicon dioxide spacer layer.
Figure 11:
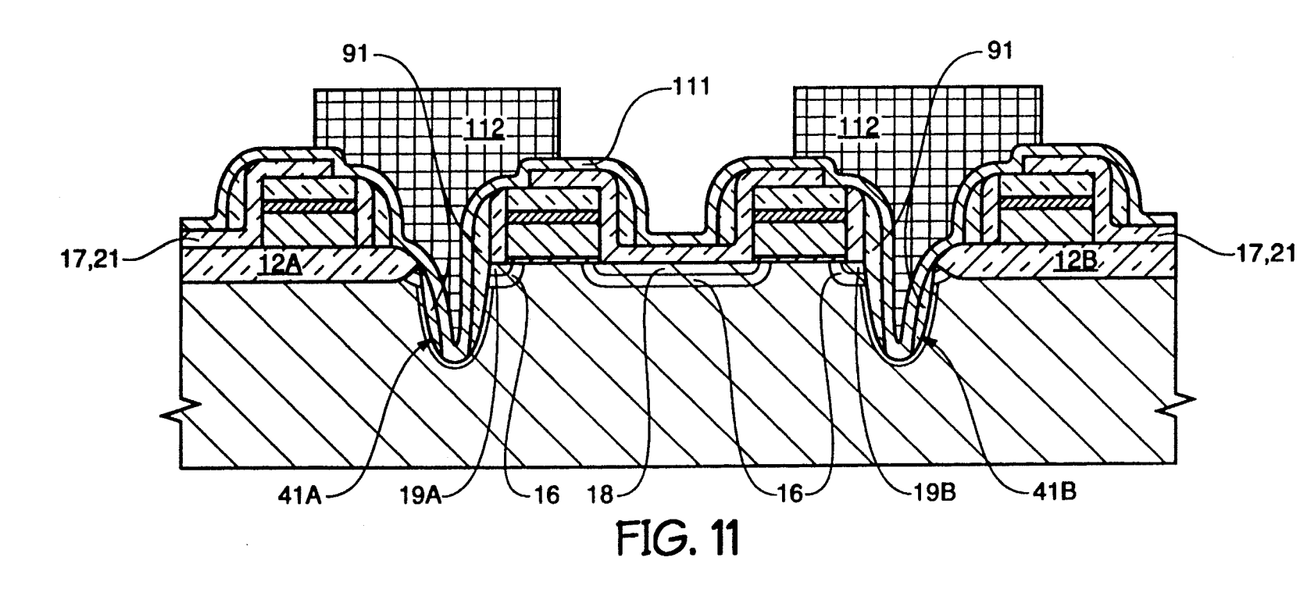
FIG. 11 is a cross-sectional view of the in-process DRAM array of FIG. 10 following deposition of a conformal storage-node plate layer, and masking of the same with photoresist.

FIGS. 9–11 depict the improved process which is the focus of the present invention. Array processing for the improved process is identical with the processing for the conventional array as processed up through FIG. 5. FIG. 9 takes up immediately following the processing as described in FIG. 5.

Referring now to FIG. 9, the array of FIG. 5 is shown following the conformal deposition of a silicon dioxide liner layer 91. A silicon nitride liner layer could be used in place of silicon dioxide liner layer 91.

Referring now to FIG. 10, the array has been subjected to an anisotropic silicon dioxide etch, which has created a silicon dioxide lining on the walls of tapered trenches 41. It will be noted that the anisotropic silicon dioxide etch has removed the portions of liner layer 91 from the bottoms of tapered trenches 41.

Referring now to FIG. 11, a storage-node polysilicon-2 layer 111 has been conformally deposited over the array surface, such that it completely lines each tapered trench 41. Following doping of the polysilicon-2 layer 111 with phosphorus, the array is masked with a storage-node plate photoresist mask 112.

Figure 12:
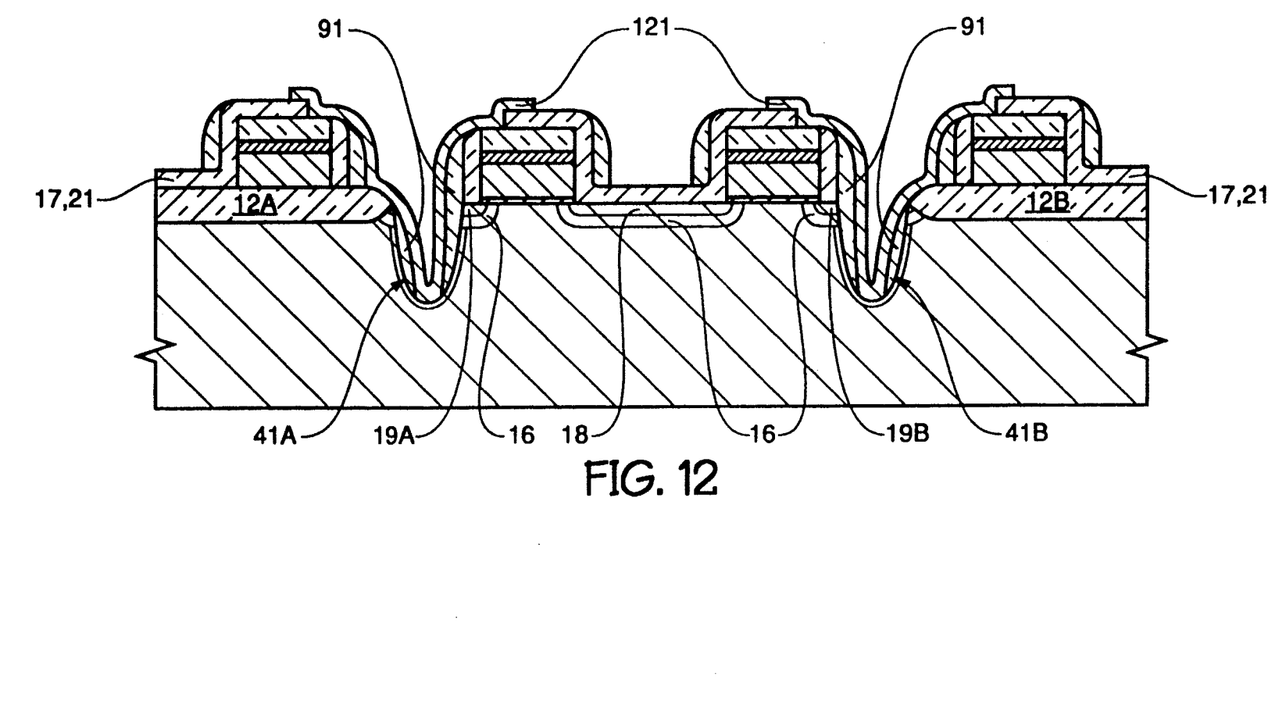
FIG. 12 is a cross-sectional view of the in-process DRAM array of FIG. 11 following an etch of the storage-node plate layer and a photoresist strip.

Referring now to FIG. 12, the array has been subjected to an isotropic polysilicon etch, which creates individual storage node plates 121. Following this etch, photoresist mask 112 is stripped.

Figure 13:
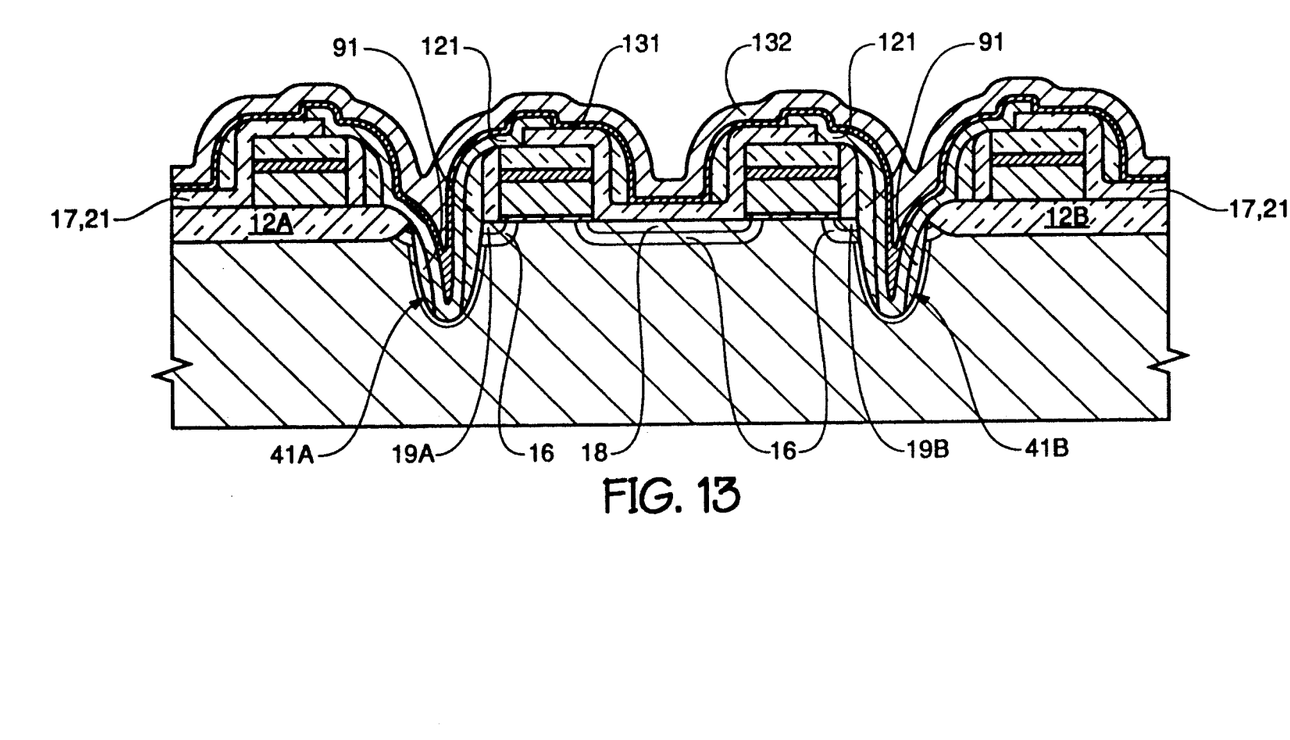
FIG. 13 is a cross-sectional view of the in-process DRAM array of FIG. 11 following deposition of a conformal capacitive dielectric layer and deposition of a cell plate layer.

Referring now to FIG. 13, a capacitor dielectric layer 131 is conformally deposited over the array's surface, following which a polysilicon-3 cell plate layer 132 is conformally deposited.

From the final capacitor structure of FIG. 13, it will be evident that the problem of outdiffusivity has been solved by elongating the phosphorus diffusivity path from the storage node plate to the access transistor channel.

Although only a single embodiment of the improved process for fabricating a stacked trench DRAM array has been disclosed herein, it will be obvious to those having ordinary skill in the art of semiconductor process technology that changes and modifications may be made thereto without departing from the spirit of the invention as claimed.

We claim:

1. An improved stacked-trench dynamic random access memory cell having a phosphorus-doped, polycrystalline silicon storage-node plate that at least partially overlies at least one adjacent wordline and extends into a trench adjacent the cell access transistor, said access transistor having both a storage-node junction and an access-node junction, the sidewalls and bottom of said trench being doped with a slow-diffusing N-type impurity, said sidewalls and bottom being in electrical communication with said storage-node junction, wherein the improvement comprises a dielectric material liner, which covers the sidewalls of the trench, said dielectric material liner acting as a barrier to diffusion of phosphorus from the storage-node plate into the access transistor channel region, with electrical contact between the storage-node plate and the storage-node junction of the access transistor being made at the bottom of the trench which is not coated with the dielectric material liner.

2. The improved stacked-trench dynamic random access memory cell of claim 1, wherein said dielectric material liner is comprised of silicon dioxide.

3. The improved stacked-trench dynamic random access memory cell of claim 1, wherein said dielectric material liner is comprised of silicon nitride.

4. The improved stacked-trench dynamic random access memory cell of claim 1, wherein said slow-diffusing impurity is arsenic.

5. The improved stacked-trench dynamic random access memory cell of claim 1, wherein said slow-diffusing impurity is antimony.

6. The improved stacked-trench dynamic random access memory cell of claim 1, wherein said trench is aligned to both an adjacent field oxide region and a spacer on the edge of the gate of said cell access transistor.

7. An improved stacked-trench cell within a dynamic random access memory (DRAM) array, said cell comprising:
- a trench adjacent the cell access transistor, said access transistor having, by definition, both a storage-node junction and an access-node junction, the sidewalls and bottom of said trench being doped with a slow-diffusing N-type impurity and being in electrical communication with said storage-node junction;
- a phosphorus-doped, polycrystalline silicon storage-node plate that at least partially overlies at least one adjacent array wordline and extends into the trench; and
- a dielectric material liner, which covers the sidewalls of the trench, said dielectric material liner acting as a barrier to diffusion of phosphorus from the storage-node plate into the access transistor channel region, with electrical contact between the storage-node the storage node junction of the access transistor being made at the bottom of the trench which is not coated with the dielectric material liner.

8. The improved stacked-trench dynamic random access memory cell of claim 7, wherein said dielectric material liner is comprised of silicon dioxide.

9. The improved stacked-trench dynamic random access memory cell of claim 7, wherein said dielectric material liner is comprised of silicon nitride.

10. The improved stacked-trench dynamic random access memory cell of claim 7, wherein said trench is aligned to both an adjacent field oxide region and a spacer on the edge of the gate of said access transistor.

* * * * *